(12) United States Patent
Eu et al.

(10) Patent No.: US 7,759,753 B2
(45) Date of Patent: Jul. 20, 2010

(54) INTEGRATED CIRCUIT DIE, INTEGRATED CIRCUIT PACKAGE, AND PACKAGING METHOD

(75) Inventors: Poh Leng Eu, Petaling Jaya (MY); Kai Yun Yow, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 169 days.

(21) Appl. No.: 12/030,213

(22) Filed: Feb. 13, 2008

(65) Prior Publication Data

US 2009/0200562 A1  Aug. 13, 2009

(51) Int. Cl.
H01L 23/34 (2006.01)
(52) U.S. Cl. ........................ 257/433; 257/432
(58) Field of Classification Search ............ 257/431, 257/432, 433, 723, 724
See application file for complete search history.

(56) References Cited

U.S. PATENT DOCUMENTS 5,362,976 A  11/1994  Suzuki
5,923,796 A *  7/1999  Feldman et al. ............ 385/14
2003/0072544 A1  4/2003  Yamaguchi
2010/0027577 A1 *  2/2010  Dutta ..................... 372/50.1

FOREIGN PATENT DOCUMENTS

| JP | 5121642 A | 5/1993 |
|---|---|---|
| JP | 6029455 A | 2/1994 |
| JP | 2000223738 A | 8/2000 |
| JP | 2000277845 A | 10/2000 |
| JP | 2000332301 A | 11/2000 |
| JP | 2001085779 A | 3/2001 |
| JP | 2002335018 A | 11/2002 |
| JP | 2004349565 A | 12/2004 |
| JP | 2005203787 A | 7/2005 |

* cited by examiner

Primary Examiner—S. V Clark
(74) Attorney, Agent, or Firm—Charles Bergere

(57) ABSTRACT

An integrated circuit package includes an integrated circuit die 1 having a plurality of optical elements 5 sensitive to and/or capable of generating light, whereby data communication to circuitry of the integrated circuit die can be effected using a data channels implemented using the plurality of elements. The data channels are along optical pathways provided by an adapter unit 17 mounted on a PCB 19. The adapter unit 17 forms the optical pathways between optical fibers 23 and the respective optical element 5. Thus, there is no requirement to implement expensive wire-bonding as part of the packaging process.

8 Claims, 4 Drawing Sheets

INTEGRATED CIRCUIT DIE, INTEGRATED CIRCUIT PACKAGE, AND PACKAGING METHOD

BACKGROUND OF THE INVENTION

The present invention relates to an integrated circuit die, an integrated circuit package, and to a method of packaging the integrated circuit die.

Conventionally, integrated circuit dies (that is, singulated portions of semiconductor wafers) are "packaged" before use. That is, they are encapsulated in a body of resin (plastics) material. Conventionally, integrated circuit dies are packaged by: placing them onto a lead frame; forming wire bonds between respective lead portions of the lead frame and electrical contacts of the die; embedding the dies, wire bonds and part of the lead portions of the lead frame in resin material; and then separating the lead portions from the rest of the lead frame.

In an alternative packaging technique, each integrated circuit die is formed with an array of electrical contacts on one of its major surfaces. A resin body is formed around each integrated circuit die, including a layer of resin on the major surface. An array of conductive balls (a "ball grid array", BGA), in register with the array of electrical contacts, extend through the resin layer, thereby forming respective electrical paths between the respective electrical contacts of the die and the major surface of the package. In use, the resulting BGA package is typically mounted directly to a printed circuit board (PCBs), with the BGA in register with electrical contacts of the PCB.

The present invention aims to provide new and useful integrated circuit dies, new and useful packaging methods for integrated circuits, and new and useful integrated circuit packages.

BRIEF DESCRIPTION OF THE DRAWINGS

Embodiments of the invention will now be described with reference to the following drawings, in which.

DETAILED DESCRIPTION OF THE EMBODIMENTS

In general terms, the invention proposes that an integrated circuit die includes a plurality of optical elements sensitive to and/or capable of generating light, whereby data communication to circuitry of the integrated circuit die can be effected using a data channel implemented using the plurality of optical elements.

Figure 1:
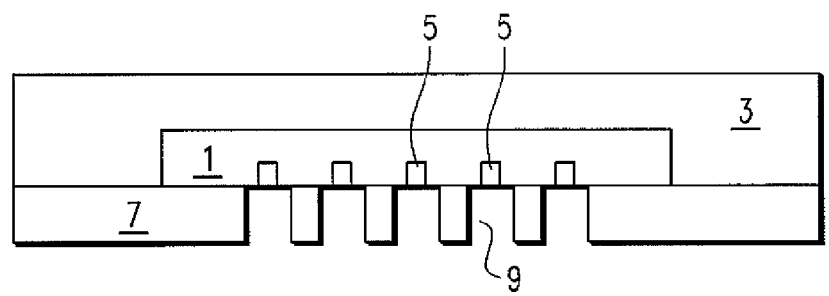
FIG. 1 is a cross-sectional view of an integrated circuit package which is a first embodiment of the present invention.

Referring to FIG. 1, an embodiment of the invention is shown in cross section. The embodiment comprises an integrated circuit die 1, which has a generally cuboidal shape, having two major surfaces. The direction that is transverse to these two major surfaces is the vertical direction in FIG. 1. On one of the major surfaces are formed a plurality of optical elements 5, typically in a regular array. The die 1 is encapsulated in a resin body 3, which joins it to a laminar support element 7, with the major surface of the die 1 that contains the optical elements 5 facing a major surface of the support element 7. A plurality of vias (through-holes, or elements of light-transmissive material) 9 are formed through the support element 7, in register with respective ones of the elements optical elements 5. The operation of the optical elements 5 is described below.

Figure 2A:
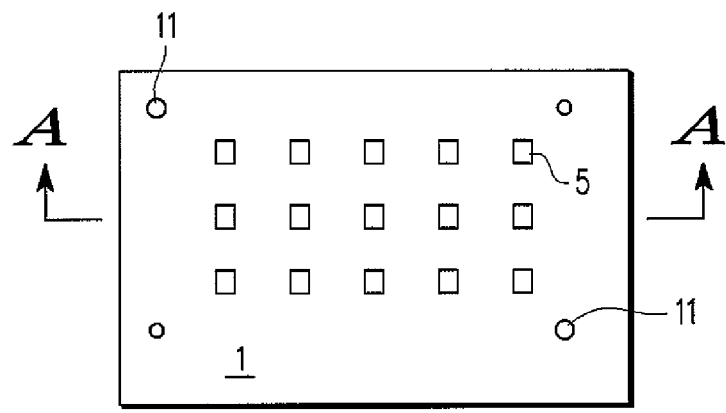
FIG. 2 is composed of FIG. 2(a), which is a plan view of the integrated circuit of the package of FIG. 1, and FIG. 2(b) which is a plan view of a support element of the package of FIG. 1.

FIG. 2(a) is a plan view of the die 1, looking towards the major surface of the die 1 on which the array of optical elements 5 is formed. The markings A-A show the line along which the cross-section of FIG. 1 is produced. As shown in FIG. 2(a), the optical elements 5 are formed as a rectangular array, having 3×5 elements. However, in other embodiments of the invention the number of optical elements 5 may be different, and their layout may not be rectangular, or even regular.

The major surface of the die 1 also includes four electrical contacts 11. These were not visible in FIG. 1, since they are not in the plane A-A. The electrical contacts 11 are used primarily for transmitting electrical power to the die 1. The number of contacts 11 may be different from four.

Figure 2B:
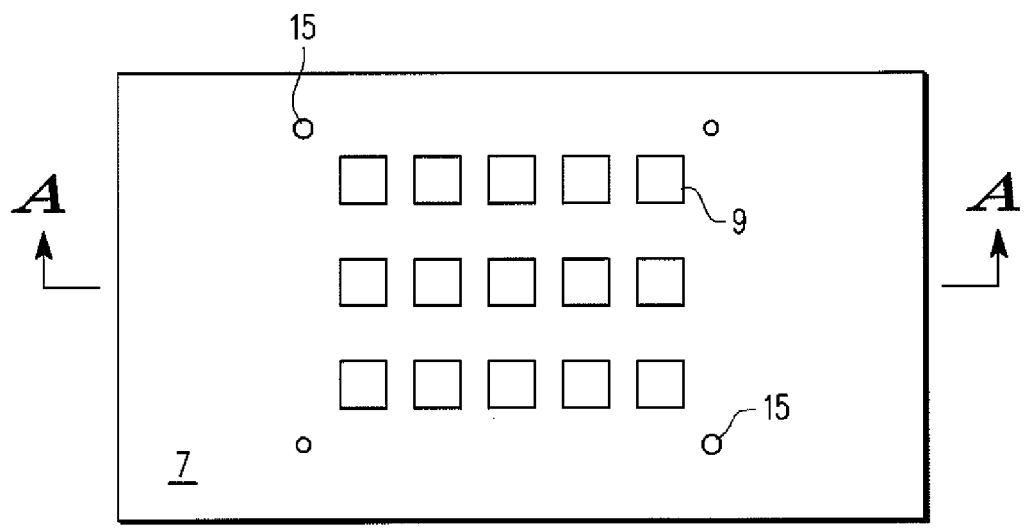

FIG. 2(b) is a plan view of the support element 7, looking towards the major surface of the support element 7, which faces and contacts the die 1. The vias 9 correspond in number and layout to the optical elements 5 on the die 1. In other embodiments, however, the vias 9 may be large enough that each is able to straddle two or more of the optical elements.

The support element 7 also includes four electrical vias 15 (bodies of electrically conductive material) which extend between the major surfaces of the support element 7, perpendicular to the major surfaces. Once the package is formed, the electrical vias 15 are in register, and electrical contact, with the respective electrical contacts 11 in the die 1, for transmitting electrical power to the die 1. The electrical vias 15 are slightly larger in diameter than the electrical contacts 11. The electrical contacts 11 on the die 1 can be ball bumped with a wire bonding process. After the resin 3 is applied, the electrical vias 15 are later filled with solder, and reflowed to make a connection between the electrical contacts 11 and the base of the support element 7.

Figure 3A:
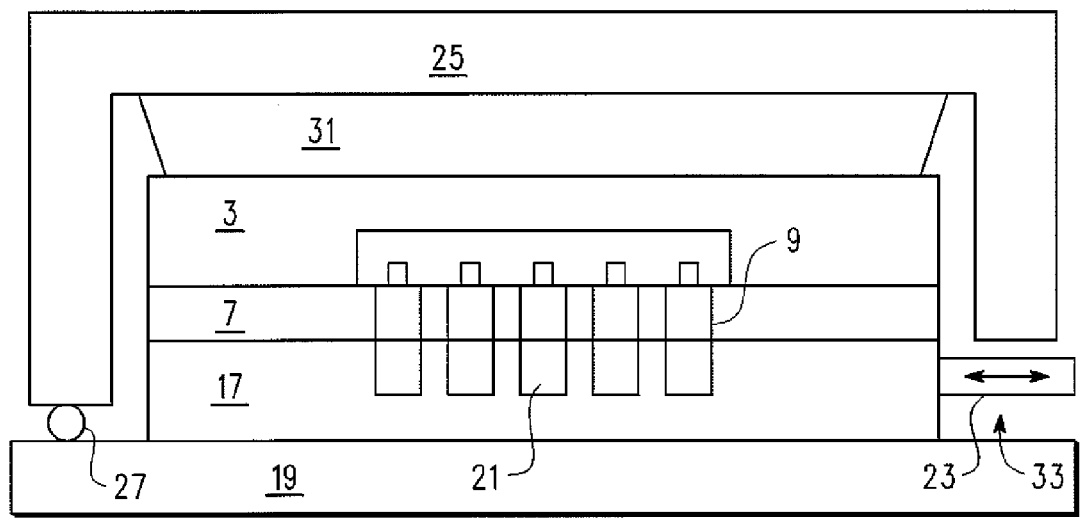
FIG. 3 is composed of FIG. 3(a), which is a cross-sectional view of the package of FIG. 1 mounted on a PCB using an adapter element, FIG. 3(b), which is a plan view of the adapter element, and FIG. 3(c) which is a cross-sectional view of a portion of the adapter element.

Turning to FIG. 3(a), an application of the package of FIG. 1 is shown. The package of FIG. 1 has been mounted on an adapter unit 17, which has previously been mounted on a PCB 19. The adapter unit 17 is shown in plan view in FIG. 3(b), looking towards its major face, which faces the support element 7. The adapter unit 17 contains an array of optical elements 21, which are in register with respective ones of the vias 9, and which transmit or receive light to/from the corresponding vias 9 from/to a corresponding optical fibre 23. A light path is thus formed between each optical element 5, through the corresponding via 9 and the corresponding optical element 21, and to a corresponding one of the optical fibres 23.

The optical fibers 23 provide optical data communication channels to circuitry (not shown, but which may be of known design) for transmitting/receiving data on the channels.

Optionally, a cover member 25 is provided, covering the package. The cover member 25 is mounted on the PCB 19 by elements 27, which provide only a physical connection (not an electronic one). The cover member 25 is placed over the package after the package is joined to the adapter unit 17. The cover member 25 functions as a heat sink, to disperse heat generated by the die 1. A heat-transmission layer 31 may be provided between the resin 3 and the cover member 25, e.g., formed of epoxy resin that is cured after, or at the same time as, the cover member 25 is fixed to the PCB 19. Between one side of the cover member 25 and the PCB 19 is a gap 33 through which the optical fibers 23 extend.

Figure 3B:
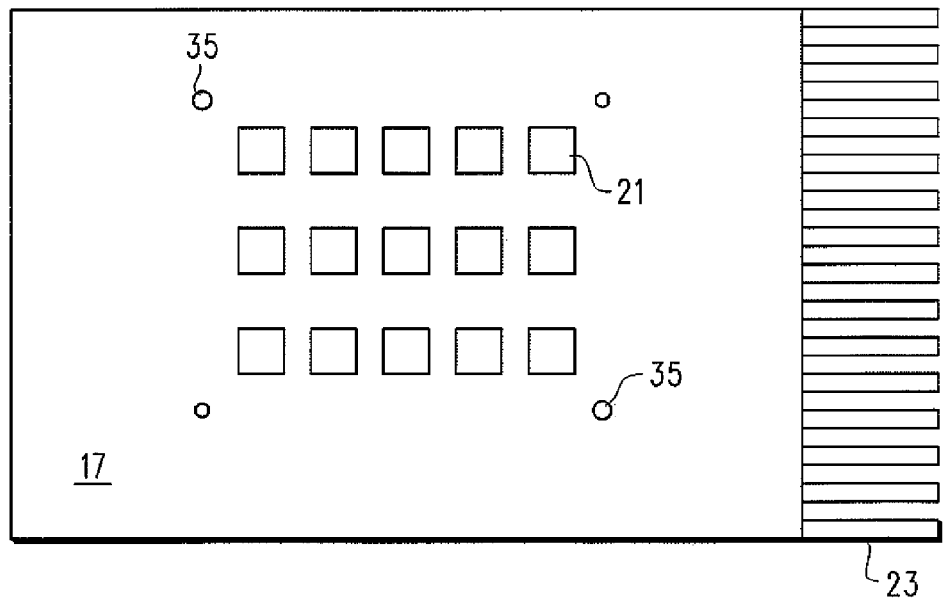

As additionally shown in FIG. 3(b), the adapter unit 17 further contains electrical contacts 35, in register and electrical contact with the electrical vias 15. The electrical contacts 35 are typically in contact with electrical contacts (not shown) on the PCB 19, and provide electric power for the circuitry of the die 1.

The optical elements 5 may each by implemented as a photo-detector or as a light-emitting element, such as an LED. It is to be understood that the term "light" as used in this document need not imply light in the visible spectrum, but may be electromagnetic radiation in a different frequency range, such as infra-red radiation.

In the case of an optical element 5 that is a photo-detector, the optical element 5 detects the light passing through the corresponding optical fibre 23, and transmitted by the corresponding optical element 21 through the corresponding via 9. The photo-detector generates a consequent electronic signal, which is fed into electronic circuitry provided within the die 1. Note that the optical element 5 may be implemented by any optically active element. For example, it may be a photo-diode or photo-transistor, or an element that is sensitive to a reflection or an inference to generate a signal.

In the case of an optical element 5 that is a light-emitting element, it is controlled by electronic circuitry within the die 1 to generate light that passes through the via 9 into the corresponding optical element 21, and from there into the corresponding optical fibre 23.

It also would be possible to use an optical element 5 that has both photo-detection capability and light-generation capability, and functions at different times as a photo-detector and as a light-emitting element (just as, in certain integrated circuits, a single electrical contact can have a different function at different times). Also, if desired, the optical emitter and detector may be in close proximity with each other, and the vias 9 can be large enough to encompass both emitter and detectors on the die.

It is also possible to use a single optical element 5 capable of performing its light-detection/light-emission operation independently in each multiple different light frequency ranges. For example, the optical element 5 may include two photo-detection elements that are respectively sensitive to IR and to blue light (or, in another example, a photo-detection element sensitive to IR and light-emitting element for generating blue light). In this case, the single optical channel from the optical element 5 to the optical fiber 23 would be capable of carrying multiple data channels, one for each of the respective frequency ranges.

The electronic circuitry of the die 1 may be powered by the electrical power from the electrical contacts 11, but preferably these contacts do not carry data to/from the die 1.

Figure 3C:
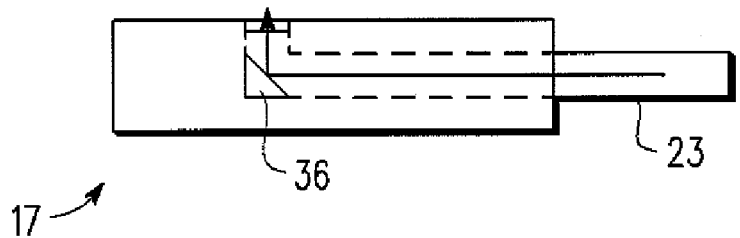

FIG. 3(c) is a cross-section of a portion of the adapter unit 17 showing that a prism or reflective mirror 36 may be provided to deflect a light beam passing from/to each respective optical fibre 23 to/from the corresponding optical element 21. This means that there is no requirement for the optical fibre 23 to bend through a high angle.

It will be noted that the embodiment of the invention there is no requirement for any wire-bonding, or formation of a BGA, to be performed, and thus the packaging may be implemented without either of these two expensive processes.

Figure 4:
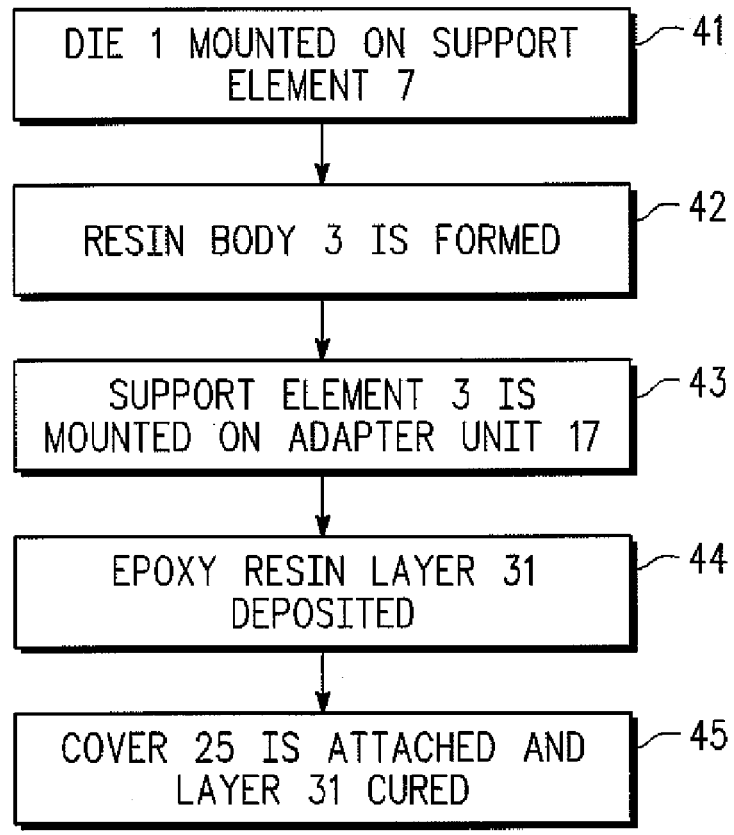
FIG. 4 is a flow diagram of a packaging method resulting in the structure of FIG. 3.

FIG. 4 sets out the steps of the method resulting in the system of FIG. 3(a). In a first step 41, a die 1 is mounted on a support element 7, with the optical element 5 in register with the vias 9, and the electrical contacts 11 in register with electric vias 15 (and optionally connected to the vias 15 electrically via conductive balls or bumps). In step 42, the resin body 3 is formed to provide the package of FIG. 1. In step 43, the exterior face of the support element 7 is mounted on the adapter unit 17, positioned on the PCB 19. In step 44, the layer 31 of epoxy resin is deposited. In step 45, the cover member 25 is attached to the PCB 19, and the epoxy resin layer 31 is cured. A high precision pick and place machine with a vision system using reference points on the die 1, support element 7, and adapter unit 17 may be used to mount the die 1 on the support element 7, and the support element 7 on the adapter unit 17. The die 1 may be held or secured during the placement operation of step 41 using an adhesive film (not shown), such as a Die Attach Film (DAF).

Figure 5:
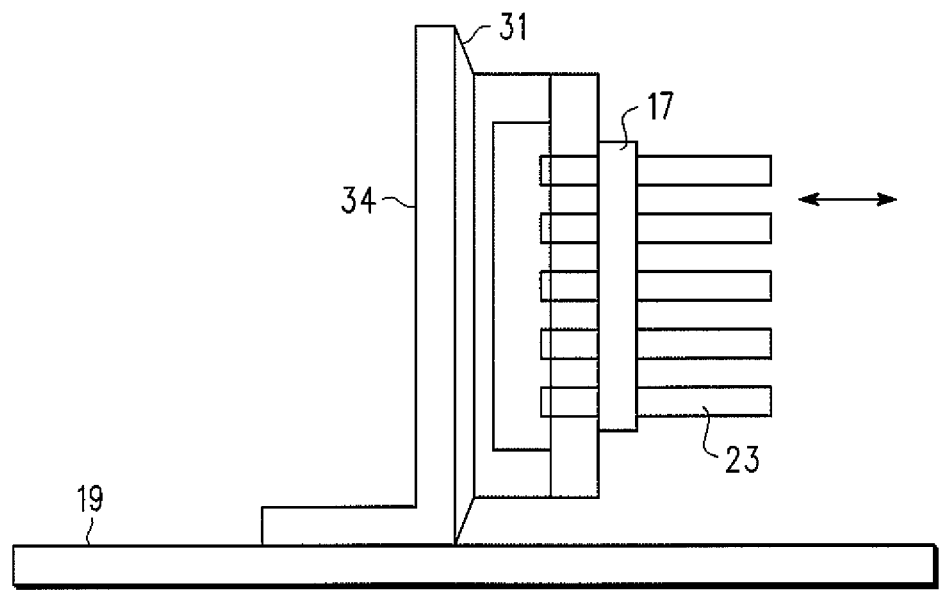
FIG. 5 is a cross-section of a second embodiment of the present invention.

FIG. 5 shows a second embodiment of the invention. Elements having the same significance as in the first embodiment are given the same reference numerals. In this second embodiment an additional mounting element 34 is provided, to support the package shown in FIG. 1 above the PCB 19. The package is attached to the mounting element 34 using the heat-transmission layer 31. This means the adapter unit 17 can couple the optical elements 5 to the respective optical elements 21 without the use of the reflectors 36 of FIG. 3(c).

Figure 6:
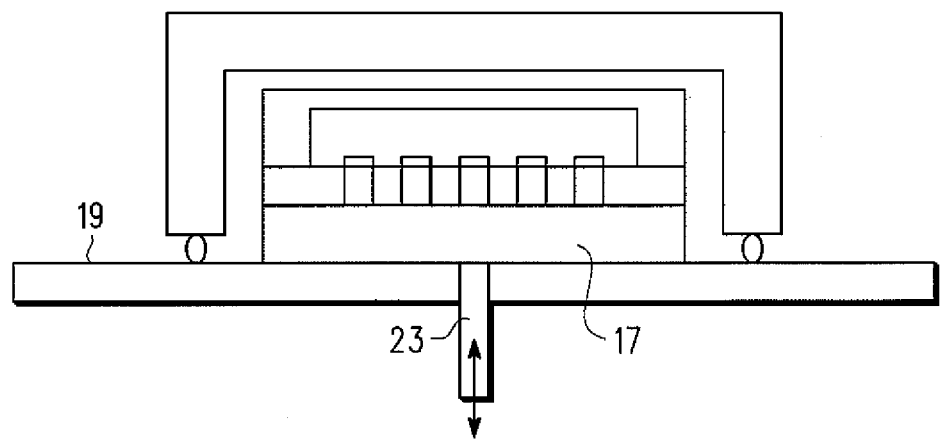
FIG. 6 is a cross-section of a third embodiment of the present invention.

FIG. 6 shows a third embodiment in which the package of FIG. 1 is mounted using the adapter unit 17 onto the PCB 19, with the major surfaces of the package generally parallel to the surface the PCB 19 (as in the first embodiment). In this case, however, the PCB 19 is provided with at least one through hole which permits an optical fibre 23 to pass through it. There may be a separate through hole for each optical element 5, or alternatively there may be a single hole and the optical fibre 23 may be a bundle of several fibres that are optically connected to the respective optical elements 5 by optical circuitry in the adapter unit 17.

Although only few embodiments of the invention has been described in detail, many variations are possible within the scope of the invention. For example, instead of the adapter unit 17 having optical fibres 23 extending therefrom, the adapter unit 17 might instead have respective electrical wires (or electrical connections to the PCB 19), and the adapter unit 17 may be constructed to convert between electronic and optical channels. Specifically, each optical element 21 of the adapter unit 17 that faces a die optical element 5, which is a photo-detector might have a light-emitting element in electronic communication with a respective electric wire; each optical element 21 of the adapter unit 17 that faces a die optical element 5 that is a light-emitting element might have a photo-detector element in electronic communication with a respective electric wire. In other words, in this variation, each pair of optical elements 5, 21 would function as an opto-coupler. An adapter unit similar to this exists in the prior art, but with solder ball connects instead of opto-couplers.

In a further variation, the optical connections to the die may be supplemented with electronic data connections. For example, it has been proposed in certain prior art documents to package a die with both wire bonds (e.g., to electrical contacts on a top surface of the die) and a BGA. By analogy, it is conceivable to imagine a variant of the embodiment described above in which wire bonds for carrying data are additionally provided, e.g., between electrical contacts on the top of the die 1 and corresponding electrical contacts on the support element 7.

The invention claimed is:

1. An integrated circuit device, comprising:
an integrated circuit die having outer surfaces and internal electronic circuitry, the electronic circuitry including a plurality of optical elements disposed within but proximate to a major surface of the die, one or more of said optical elements including an optical detector, and one or more of the optical elements including an optical transmitter;
a plurality of electrical contacts coupled with the electronic circuitry;
a laminar support element that supports the integrated circuit die, wherein the laminar support element includes a plurality of vias in register with the plurality of optical elements, the vias allowing light to be transmitted to and from the plurality of optical elements, and wherein the electronic circuitry is powered by electrical power received by way of the electrical contacts, for processing data signals generated by the one or more optical detectors, and to generate data signals for transmission by the one or more optical transmitters; and
a resin body surrounding the outer surfaces of the integrated circuit die not supported by the laminar support element.

2. The integrated circuit device of claim 1, further comprising:
an adapter unit on which the support element is mounted, the adapter unit comprising optical pathways for transmitting optical signals to the optical detectors through the vias, and receiving optical signals from the optical transmitters through the vias.

3. The integrated circuit device of claim 2, wherein the adapter unit further comprises electrical paths in contact with the electrical contacts for transmitting electrical power to the electrical contacts.

4. The integrated circuit device of claim 2, wherein the adapter unit includes a plurality of optical fibres, each optical fibre being in optical communication with at least one corresponding said optical pathway.

5. The integrated circuit device of claim 4, wherein the adapter unit includes one or more elements for deflecting a beam of light transmitted between one of the optical fibers and a corresponding one of the optical elements.

6. The integrated circuit device according to claim 2, wherein the adapter unit is mounted on a printed circuit board.

7. The integrated circuit device of claim 6, further comprising a heat sink element mounted on the printed circuit board and thermally coupled to the integrated circuit die.

8. The integrated circuit device of claim 7, wherein the heat sink element is thermally coupled to the die by a cured resin layer.

* * * * *